US012787397B2

(12) United States Patent
Ma et al.

(10) Patent No.: US 12,787,397 B2
(45) Date of Patent: Nov. 3, 2026

(54) ENHANCED GAN-BASED HEMT DEVICE, DEVICE EPITAXY, AND PREPARATION METHODS THEREOF

(71) Applicant: Genettice ( Qingdao ) Semiconductor Materials Co., Ltd., Qingdao (CN)

(72) Inventors: Wang Ma, Qingdao (CN); Long Chen, Qingdao (CN); Jingyun Cheng, Qingdao (CN); Zuyao Chen, Qingdao (CN); Hongchao Wang, Qingdao (CN); Li Yuan, Qingdao (CN)

(73) Assignee: Genettice (Qingdao) Semiconductor Materials Co., Ltd., Qingdao City (CN)

( * ) Notice: Subject to any disclaimer, the term of this patent is extended or adjusted under 35 U.S.C. 154(b) by 346 days.

(21) Appl. No.: 18/686,448

(22) PCT Filed: Apr. 26, 2022

(86) PCT No.: PCT/CN2022/089132

§ 371 (c)(1),
(2) Date: Feb. 26, 2024

(87) PCT Pub. No.: WO2023/024550

PCT Pub. Date: Mar. 2, 2023

(65) Prior Publication Data

US 2024/0363694 A1 Oct. 31, 2024

(30) Foreign Application Priority Data

Aug. 27, 2021 (CN) ........................ 202110995683.9

(51) Int. Cl.
*H10D 62/854* (2025.01)
*H10D 30/47* (2025.01)
(Continued)

(52) U.S. Cl.
CPC ....... *H10D 62/854* (2025.01); *H10D 62/8503* (2025.01); *H10P 14/24* (2026.01);
(Continued)

(58) Field of Classification Search
CPC .......... H10D 30/47–485; H10D 30/015; H10P 14/3822
See application file for complete search history.

(56) References Cited

U.S. PATENT DOCUMENTS

2014/0264441 A1* 9/2014 Murase ................ H10D 30/015
257/190
2015/0021652 A1 1/2015 Ueta et al.
(Continued)

FOREIGN PATENT DOCUMENTS

CN 107611174 A 1/2018
CN 111564490 A 8/2020
(Continued)

*Primary Examiner* — Wael M Fahmy
*Assistant Examiner* — Quinton A Brasfield
(74) *Attorney, Agent, or Firm* — IPRTOP LLC

(57) ABSTRACT

The epitaxy sequentially includes from bottom to top a C-doped c-GaN high-resistance layer (11), an intrinsic u-GaN channel layer (12), an AlGaN barrier layer (13), a magnesium diffusion blocking layer (14), and a Mg-doped p-GaN cap layer (15) that are formed on a substrate (10). The magnesium diffusion blocking layer (14) includes a Mg-doped p-AlGaN layer (141). Mg in the Mg-doped p-AlGaN layer (141) is sufficiently passivated to in the Mg—H bond form, to reduce the activity of Mg. A doping concentration of Mg in the Mg-doped p-AlGaN layer (141) is greater than that of Mg in the Mg-doped p-GaN cap layer (15). A specific concentration difference of Mg is formed between them, so that Mg in the Mg-doped p-GaN cap layer (15) can be effectively blocked from diffusing downward into the AlGaN barrier layer (13) and the intrinsic u-GaN
(Continued)

channel layer (12), thereby improving conducting performance of the device.

3 Claims, 1 Drawing Sheet

(51) Int. Cl.
*H10D 62/85* (2025.01)
*H10P 14/20* (2026.01)
*H10P 14/24* (2026.01)

(52) U.S. Cl.
CPC ..... *H10P 14/3822* (2026.01); *H10D 30/4755* (2025.01); *H10P 14/3416* (2026.01)

(56) References Cited

U.S. PATENT DOCUMENTS

2016/0056245 A1* 2/2016 Kinoshita ............ H10D 30/015 438/191
2021/0336011 A1* 10/2021 Lin ...................... H10D 62/824
2022/0384673 A1* 12/2022 Chae ...................... H10H 20/01

FOREIGN PATENT DOCUMENTS

CN 112133749 A 12/2020
CN 112701160 A * 4/2021 ........... H10D 30/015
CN 113782600 12/2021

* cited by examiner

ENHANCED GAN-BASED HEMT DEVICE, DEVICE EPITAXY, AND PREPARATION METHODS THEREOF

FIELD OF THE INVENTION

The present disclosure relates to the field of semiconductor manufacturing technologies, and in particular, to an enhanced GaN-based HEMT device, a device epitaxy, and a preparation method thereof.

BACKGROUND OF THE INVENTION

Wide-bandgap semiconductors are the third-generation semiconductor material following silicon and gallium arsenide, and have been attracting increasing attention in recent years. At present, widely studied semiconductor materials mainly include III-V group and II-VI group compound semiconductor materials, silicon carbide (SiC), diamond films, and the like, which are widely applied in blue-green LEDs, ultraviolet LEDs, LDs, detectors, and microwave power devices. These semiconductor materials have received a great deal of attention, due to their excellent characteristics and wide application. Especially, the gallium nitride (GaN) material in III-V group semiconductor materials has become a research hotspot in the current global semiconductor field because of its commercial application in the field of semiconductor lighting.

GaN, as a third-generation semiconductor, has superior semiconductor performance such as large bandgap width, high breakdown field strength, high electron mobility, and a good thermal resistance characteristic and good radiation resistance characteristic, therefore, it is applicable to high-temperature, high-frequency, high-power, and high-breakdown voltage electrical and electronic devices. HEMT devices based on a two-dimensional electron gas at an AlGaN/GaN heterojunction become a research focus of electrical and electronic devices nowadays and show great application potential.

Different from Si-based electrical and electronic devices, problems in the substrate and doping technologies for GaN-based electrical and electronic devices are still not completely resolved. The manufacturing of GaN-based electrical and electronic devices is mostly realized by using the two-dimensional electron gas at the heterojunction structure of the GaN material system. The two-dimensional electron gas is formed at the AlGaN/GaN interface since there are strong spontaneous polarization and piezoelectric polarization in the GaN-based heterojunction. The conventional GaN-based HEMT is a depletion-type device, which is also referred to as a normally-on type device, and a negative-voltage power supply is required to turn off the GaN-based HEMT during actual circuit applications. This not only increases the risk of turning on a circuit by mistake, but also the power consumption of the entire circuit, thus, the enhanced GaN-based HEMT device is more applicable to the electrical and electronic circuits. In the process of improving the enhanced AlGaN/GaN HEMT device, the main object is to deplete the under-gate two-dimensional electron gas through various technical measures, so that when a gate is not biased, the device can be in an off state. The mainly existing methods for improving the enhanced GaN-based HEMT device in the scientific communities include a pGaN enhancement technique (a p-type cap layer technique), a thin barrier layer structure, a trench gate structure, a fluorine ion injection technique, and the like, where the p-type cap layer technique is most commonly used.

However, in the enhanced pGaN HEMT, Mg in pGaN easily diffuses into the AlGaN barrier layer and the channel layer, and as a result, a specific on-resistance of the device is increased, thus affecting device performance. Therefore, it is necessary to provide an enhanced GaN-based HEMT device structure and a fabricating process.

SUMMARY OF THE INVENTION

In view of the foregoing deficiencies in the prior art, the present invention provides an enhanced GaN-based HEMT device, a device epitaxy, and a preparation method thereof, which blocks the diffusion of Mg in the pGaN cap layer into the AlGaN barrier layer and the channel layer, and as a result, reducing the specific on-resistance of the device.

The present invention provides an enhanced GaN-based HEMT device epitaxy, which sequentially comprises from bottom to top a C-doped c-GaN high-resistance layer, an intrinsic u-GaN channel layer, an AlGaN barrier layer, a magnesium diffusion blocking layer, and a Mg-doped p-GaN cap layer that are formed on a substrate; where the magnesium diffusion blocking layer comprises a Mg-doped p-AlGaN layer. Mg in the Mg-doped p-AlGaN layer is sufficiently passivated to in a Mg—H bond form, so as to reduce the activity of Mg in the Mg-doped p-AlGaN layer, and a doping concentration of Mg in the Mg-doped p-AlGaN layer is greater than a doping concentration of Mg in the Mg-doped p-GaN cap layer, so as to block Mg in the Mg-doped p-GaN cap layer from diffusing downward.

Further, the magnesium diffusion blocking layer also comprises a GaN cap layer, and the GaN cap layer is an uppermost layer of the magnesium diffusion blocking layer.

Further, a thickness of the Mg-doped p-AlGaN layer ranges from 1 nm to 30 nm, and a thickness of the GaN cap layer is not greater than 40 nm.

Optionally, the Mg—H bond of the Mg-doped p-AlGaN layer is formed by using a hydrogen annealing process.

Further, a method for forming the Mg—H bond in the Mg-doped p-AlGaN layer comprises: forming an InN layer on the Mg-doped p-AlGaN layer, and then forming the Mg—H bond of the Mg-doped p-AlGaN layer by using the hydrogen annealing process, where the InN layer is heated to completely decompose during the hydrogen annealing process, so that an interface of the Mg-doped p-AlGaN layer is kept from damage caused by the hydrogen annealing process.

Further, a thickness of the InN layer is not greater than 10 nm.

Optionally, a buffer layer is formed between the substrate and the C-doped c-GaN high-resistance layer.

Optionally, the doping concentration of Mg in the Mg-doped p-AlGaN layer ranges from 5.5E+18 $cm^{-3}$ to 8E+19 $cm^{-3}$, and the doping concentration of Mg in the Mg-doped p-GaN cap layer ranges from 5E+18 $cm^{-3}$ to 7.5E+19 $cm^{-3}$.

The present invention further provides an enhanced GaN-based HEMT device. The HEMT device is prepared from any foregoing enhanced GaN-based HEMT device epitaxy.

The present invention further provides a preparation method for the enhanced GaN-based HEMT device epitaxy. The method comprises:

providing a substrate; and sequentially depositing a C-doped c-GaN high-resistance layer, an intrinsic u-GaN channel layer, an AlGaN barrier layer, a magnesium diffusion blocking layer, and a Mg-doped p-GaN cap layer on the substrate by using a MOCVD process, where the magnesium diffusion blocking layer comprises an Mg-doped p-AlGaN layer, Mg in the Mg-doped p-AlGaN layer is sufficiently passivated to in a Mg—H bond form through annealing in a $H_2$ atmosphere, so as to reduce the activity of Mg, and a doping concentration of Mg in the Mg-doped p-AlGaN layer is greater than a doping concentration of Mg in the Mg-doped p-GaN cap layer, so as to block Mg in the Mg-doped p-GaN cap layer from diffusing downward.

Optionally, deposition parameters of the magnesium diffusion blocking layer are as follows: a growth temperature ranges from 700° C. to 1160° C., and a growth pressure ranges from 20 mbar to 500 mbar.

Optionally, a method for forming a Mg—H bond in the Mg-doped p-AlGaN layer comprises: forming an InN layer on the Mg-doped p-AlGaN layer, and then performing annealing in a $H_2$ atmosphere after the InN layer is formed to make Mg in the Mg-doped p-AlGaN layer sufficiently passivated to form the Mg—H bond, where the InN layer is heated to completely decompose during the $H_2$ annealing process, so that an interface of the Mg-doped p-AlGaN layer is kept from damage caused by the $H_2$ annealing process.

The present invention further provides a preparation method for the enhanced GaN-based HEMT device. The preparation method comprises any foregoing preparation method for the GaN-based HEMT device epitaxy.

As discussed above, the enhanced GaN-based HEMT device, the device epitaxy, and the preparation method thereof are provided in the present invention, where the magnesium diffusion blocking layer is disposed between the AlGaN barrier layer and the Mg-doped p-GaN cap layer. Mg in the Mg-doped P-AlGaN layer in the structure of the magnesium diffusion blocking layer is sufficiently passivated to in the Mg—H bond form, which has large bond strength, therefore, the activity of Mg can be effectively reduced, so that it is nearly impossible for Mg in the Mg-doped p-AlGaN layer to diffuse downward into the AlGaN barrier layer and the intrinsic u-GaN channel layer. In addition, the doping concentration of Mg in the Mg-doped p-AlGaN layer is greater than the doping concentration of Mg in the Mg-doped p-GaN cap layer, therefore, a concentration difference of Mg is formed between them, so that Mg in the Mg-doped p-GaN cap layer can be effectively blocked from diffusing downward, and the diffusion of Mg in the Mg-doped p-GaN cap layer into the AlGaN barrier layer and the intrinsic u-GaN channel layer can also be effectively blocked, thus reducing a specific on-resistance of the device and improving the conducting performance of the device.

Figure 1:
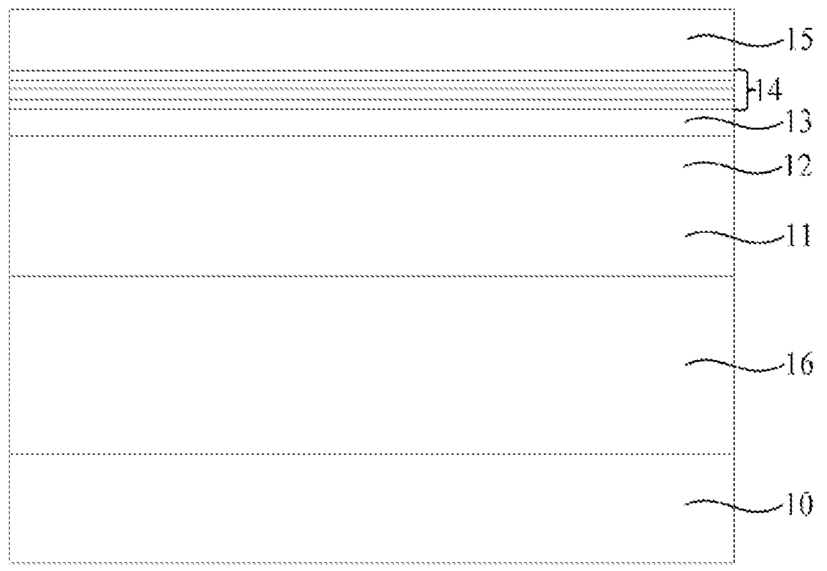
FIG. 1 shows a schematic structural diagram of an enhanced GaN-based HEMT device epitaxy according to the present invention.

| Reference Numerals | |
|---|---|
| 10 | Substrate |
| 11 | C-doped c-GaN high-resistance layer |
| 12 | Intrinsic u-GaN channel layer |
| 13 | AlGaN barrier layer |
| 14 | Magnesium diffusion blocking layer |
| 141 | Mg-doped p-AlGaN layer |
| 142 | InN layer |
| 143 | GaN cap layer |
| 15 | Mg-doped p-GaN cap layer |
| 16 | Buffer layer |

DETAILED DESCRIPTION OF THE INVENTION

The following describes the embodiments of the present invention through specific examples. A person skilled in the art can easily understand other advantages and effects of the present invention from the content disclosed in this specification. The present invention may be implemented or applied through other different specific embodiments. Various details in this specification may also be modified or changed based on different viewpoints and applications without departing from the spirit of the present invention.

Figure 2:
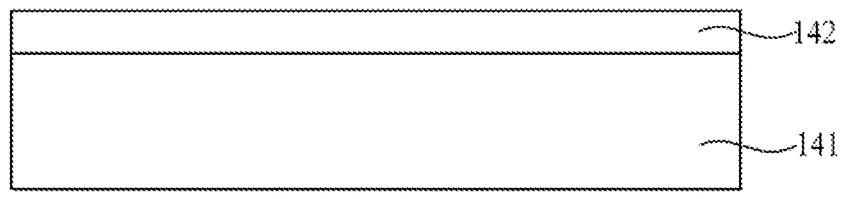
FIG. 2 shows a schematic structural diagram of an exemplary magnesium diffusion blocking layer in a preparation process for the enhanced GaN-based HEMT device epitaxy according to the present invention.
Figure 3:
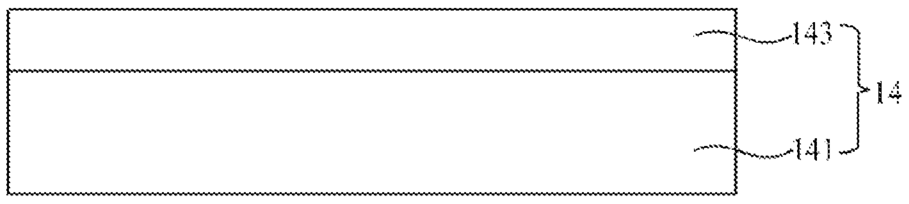
FIG. 3 shows a schematic structural diagram of an exemplary magnesium diffusion blocking layer in the enhanced GaN-based HEMT device epitaxy according to the present invention.

When referring to FIG. 1 to FIG. 3, it should be noted that the drawings provided in this embodiment only exemplarily illustrate the basic idea of the present invention. Therefore, only the components related to the present invention are shown in the drawings, and are not drawn according to the number, shape, and size of the components during actual implementation. The type, number, and proportion of the components may be changed according to an actual requirement, and the layout of the components may be more complicated.

Embodiment 1

As shown in FIG. 1, this embodiment provides an enhanced GaN-based HEMT device epitaxy. The epitaxy sequentially comprises from bottom to top a C-doped c-GaN high-resistance layer 11, an intrinsic u-GaN channel layer 12, an AlGaN barrier layer 13, a magnesium diffusion blocking layer 14, and a Mg-doped p-GaN cap layer 15 that are formed on a substrate 10.

As shown in FIG. 2 and FIG. 3, the magnesium diffusion blocking layer 14 comprises a Mg-doped p-AlGaN layer 141, where Mg in the Mg-doped p-AlGaN layer 141 is sufficiently passivated to in a Mg—H bond form, so as to reduce activity of Mg, and a doping concentration of Mg in the Mg-doped p-AlGaN layer 141 is greater than a doping concentration of Mg in the Mg-doped p-GaN cap layer 15, so as to block Mg in the Mg-doped p-GaN cap layer 15 from diffusing downward.

For the enhanced GaN-based HEMT device epitaxy in this embodiment, a magnesium diffusion blocking layer 14 is disposed between the AlGaN barrier layer 13 and the Mg-doped p-GaN cap layer 15. Mg in the Mg-doped p-AlGaN layer 141 in the structure of the magnesium diffusion blocking layer 14 is sufficiently passivated to in the Mg—H bond form, whose bond strength is very large, therefore, the activity of Mg can be effectively reduced, so that it is nearly impossible for Mg in the Mg-doped p-AlGaN layer 141 to diffuse downward into the AlGaN barrier layer 13 and the intrinsic u-GaN channel layer 12. In addition, the doping concentration of Mg in the Mg-doped p-AlGaN layer 141 is greater than the doping concentration of Mg in the Mg-doped p-GaN cap layer 15, which results in the forming of a specific concentration difference of Mg therebetween, therefore, Mg in the Mg-doped p-GaN cap layer 15 can be effectively blocked from diffusing downward, and the diffusion of Mg in the Mg-doped p-GaN cap layer 15 into the AlGaN barrier layer 13 and the intrinsic u-GaN channel layer 12 is also effectively blocked, thus reducing a specific on-resistance of the device and improving the conducting performance of the device.

As an example shown in FIG. 1, a buffer layer 16 is formed between the substrate 10 and the C-doped c-GaN high-resistance layer 11. The buffer layer 16 is used for mitigating the lattice mismatch and thermal mismatch between the substrate 10 and the C-doped c-GaN high-resistance layer 11, to improve the growth quality of the epitaxial structure. In an example, a doping concentration of the C-doped c-GaN high-resistance layer 11 may be set according to an actual resistance characteristic requirement. The typical doping concentration of the C-doped c-GaN high-resistance layer 11 ranges from 1E+18 $cm^{-3}$ to 3E+19 $cm^{-3}$, which is not limited thereto.

Generally, as long as the doping concentration of Mg in the Mg-doped p-AlGaN layer 141 is greater than the doping concentration of Mg in the Mg-doped p-GaN cap layer 15, diffusion blocking effect for Mg in the Mg-doped p-GaN cap layer 15 can be provided. As can be learned, the larger the concentration difference of Mg between them, the better the blocking effect. Considering the doping concentration of Mg in the Mg-doped p-AlGaN layer 141 may be regulated by adjusting growth conditions, the doping concentration of Mg in the Mg-doped p-AlGaN layer 141 may even be nearly saturated. In practice, the doping concentration of Mg in the Mg-doped p-AlGaN layer 141 usually ranges from 5.5E+18 $cm^{-3}$ to 8E+19 $cm^{-3}$, and the doping concentration of Mg in the Mg-doped p-GaN cap layer 15 ranges from 5E+18 $cm^{-3}$ to 7.5E+19 $cm^{-3}$, where the endpoint values are included.

In an example, the Mg—H bond of the Mg-doped p-AlGaN layer 141 may be formed by using a hydrogen annealing process. Specifically, after the Mg-doped p-AlGaN layer 141 is formed, it is annealed in a hydrogen atmosphere, so that Mg ions combine with hydrogen ions sufficiently to form the Mg—H bond to complete passivation.

In an example, a thickness of the Mg-doped p-AlGaN layer 141 usually ranges from 1 nm to 30 nm, where the endpoint values are included.

As an example shown in FIG. 2, the forming of the Mg—H bond in the Mg-doped p-AlGaN layer 141 by using the hydrogen annealing process comprises: forming an InN layer 142 on the Mg-doped p-AlGaN layer 141, and then forming the Mg—H bond in the Mg-doped p-AlGaN layer 141 by using the hydrogen annealing process, where the InN layer 142 is heated to completely decompose during the hydrogen annealing process, so that an interface of the Mg-doped p-AlGaN layer 141 is kept from damage caused by the hydrogen annealing process, thus interface appearance and crystal quality of the Mg-doped p-AlGaN layer 141 are ensured. It should be noted that process optimization may be performed to make the InN layer 142 perfectly and completely decomposed without residue during the hydrogen annealing process. Preferably, a thickness of the InN layer 142 usually is not greater than 10 nm.

As an example shown in FIG. 3, the magnesium diffusion blocking layer 14 may further comprise a GaN cap layer 143. The GaN cap layer 143 is formed on the Mg-doped p-AlGaN layer 141. Preferably, a thickness of the GaN cap layer 143 usually is not greater than 40 nm. The GaN cap layer 143 may further protect interface appearance and provide a transition to the Mg-doped p-GaN cap layer 15.

The enhanced GaN-based HEMT device epitaxy in this embodiment is described below with reference to specific experimental examples.

Experimental Example 1

As shown in FIG. 1 and FIG. 2, this experimental example provides the enhanced GaN-based HEMT device epitaxy. The epitaxy sequentially comprises from bottom to top the buffer layer 16, the C-doped c-GaN high-resistance layer 11, the intrinsic u-GaN channel layer 12, the AlGaN barrier layer 13, the magnesium diffusion blocking layer 14, and the Mg-doped p-GaN cap layer 15 that are formed on the substrate 10.

The substrate 10 may be selectively a Si substrate, a C-plane sapphire substrate, a SiC substrate, or a GaN substrate, or may be any other conventional substrate.

The buffer layer 16 may be an AlN layer, an AlGaN layer, or a GaN layer, or may be a superlattice structure formed by periodically alternating laminates, where the laminate consists of the AlN layer, the AlGaN layer, and the GaN layer.

A doping concentration of the C-doped c-GaN high-resistance layer 11 is 5E+18 $cm^{-3}$.

The magnesium diffusion blocking layer 14 sequentially comprises from bottom top the Mg-doped p-AlGaN layer 141, the InN layer 142, and the GaN cap layer 143. A thickness of the Mg-doped p-AlGaN layer 141 is 3 nm, a thickness of the InN layer 142 is 1.5 nm, and a thickness of the GaN cap layer 143 is 2 nm.

A doping concentration of Mg in the Mg-doped p-AlGaN layer 141 is 8E+19 $cm^{-3}$, and a doping concentration of Mg in the Mg-doped p-GaN cap layer 15 is 3E+19 $cm^{-3}$.

After the Mg-doped p-AlGaN layer 141 and the InN layer 142 in the magnesium diffusion blocking layer 14 are grown, hydrogen annealing in a hydrogen atmosphere is performed, so that Mg in the Mg-doped p-AlGaN layer 141 is sufficiently passivated to form the Mg—H bond, and the InN layer 142 is heated to decompose. Process optimization may be performed to make the InN layer 142 perfectly and completely decomposed without residue during the hydrogen annealing process. Then the GaN cap layer 143 is grown.

Growth conditions of the magnesium diffusion blocking layer 14 can be regulated, so that diffusion of Mg in the Mg-doped p-GaN cap layer 15 into the AlGaN barrier layer 13 and the intrinsic u-GaN channel layer 12 can be effectively blocked, thus reducing a specific on-resistance of the device, and improving the conducting performance of the device.

Experimental Example 2

As shown in FIG. 1 and FIG. 3, this experimental example provides an enhanced GaN-based HEMT device epitaxy. The epitaxy sequentially comprises from bottom to top the buffer layer 16, the C-doped c-GaN high-resistance layer 11, the intrinsic u-GaN channel layer 12, the AlGaN barrier layer 13, the magnesium diffusion blocking layer 14, and the Mg-doped p-GaN cap layer 15 that are formed on the substrate 10.

The substrate 10 may be selectively a Si substrate, a C-plane sapphire substrate, a SiC substrate, or a GaN substrate, or may be any other conventional substrate.

The buffer layer 16 may be an AlN layer, an AlGaN layer, or a GaN layer, or may be a superlattice structure formed by periodically alternating laminates, where the laminate consists of the AlN layer, the AlGaN layer, and the GaN layer.

A doping concentration of the C-doped c-GaN high-resistance layer 11 is 5E+18 $cm^{-3}$.

The magnesium diffusion blocking layer 14 sequentially comprises from bottom top the Mg-doped p-AlGaN layer 141 and the GaN cap layer 143. A thickness of the Mg-doped p-AlGaN layer 141 is 5 nm, and a thickness of the GaN cap layer 143 is 2 nm.

A doping concentration of Mg in the Mg-doped p-AlGaN layer 141 is 5E+19 $cm^{-3}$ and a doping concentration of Mg in the Mg-doped p-GaN cap layer 15 is 3E+19 $cm^{-3}$.

After the Mg-doped p-AlGaN layer 141 in the magnesium diffusion blocking layer 14 is grown, hydrogen annealing in a hydrogen atmosphere is performed, so that Mg in the Mg-doped p-AlGaN layer 141 is sufficiently passivated to form the Mg—H bond, and then the GaN cap layer 143 is grown.

Growth conditions of the magnesium diffusion blocking layer 14 can be regulated, so that diffusion of Mg in the Mg-doped p-GaN cap layer 15 into the AlGaN barrier layer 13 and the intrinsic u-GaN channel layer 12 can be effectively blocked, thus reducing a specific on-resistance of the device, and improving the conducting performance of the device.

This embodiment further provides an enhanced GaN-based HEMT device. The enhanced GaN-based HEMT device is prepared based on the enhanced GaN-based HEMT device epitaxy provided in this embodiment.

Embodiment 2

This embodiment provides a preparation method for the enhanced GaN-based HEMT device epitaxy. The preparation method may be used for preparing the enhanced GaN-based HEMT device epitaxy in the foregoing Embodiment 1. For beneficial effects that can be achieved by the preparation method, please refer to Embodiment 1, therefore, details will not repeated below.

As shown in FIG. 1, the preparation method for the enhanced GaN-based HEMT device epitaxy comprises:

providing the substrate 10; and sequentially depositing the C-doped c-GaN high-resistance layer 11, the intrinsic u-GaN channel layer 12, the AlGaN barrier layer 13, the magnesium diffusion blocking layer 14, and the Mg-doped p-GaN cap layer 15 on the substrate 10 by using a MOCVD process, where the magnesium diffusion blocking layer 14 comprises the Mg-doped p-AlGaN layer 141, Mg in the Mg-doped p-AlGaN layer 141 is sufficiently passivated to in the Mg—H bond form through annealing in a $H_2$ atmosphere, so as to reduce activity of Mg, and a doping concentration of Mg in the Mg-doped p-AlGaN layer 141 is greater than a doping concentration of Mg in the Mg-doped p-GaN cap layer 15, so as to block Mg in the Mg-doped p-GaN cap layer 15 from diffusing downward.

In an example, deposition parameters of the magnesium diffusion blocking layer 14 are as follows: a growth temperature ranges from 700° C. to 1160° C., and a growth pressure ranges from 20 mbar to 500 mbar.

As an example shown in FIG. 2, the forming of the Mg—H bond in the Mg-doped p-AlGaN layer 141 comprises: forming an InN layer 142 on the Mg-doped p-AlGaN layer 141, and then performing annealing in a $H_2$ atmosphere after the InN layer 142 is formed, so that Mg in the Mg-doped p-AlGaN layer 141 is sufficiently passivated to form the Mg—H bond. Mg in the Mg-doped p-AlGaN layer 141 is sufficiently passivated by using the $H_2$ atmosphere to form the Mg—H bond, and the InN layer 142 is heated to decompose. Process optimization may be performed to make the InN layer 142 perfectly and completely decomposed without residue during the hydrogen annealing process, to protect an interface of the Mg-doped p-AlGaN layer 141 from being damaged caused by the hydrogen annealing process, thus ensuring the interface appearance and crystal quality of the Mg-doped p-AlGaN layer 141.

This embodiment further provides a preparation method for the enhanced GaN-based HEMT device. The preparation method comprises the preparation method for the enhanced GaN-based HEMT device epitaxy provided in this embodiment.

In summary, the enhanced GaN-based HEMT device, the device epitaxy, and the preparation method thereof are provided in the present invention, where the magnesium diffusion blocking layer is disposed between the AlGaN barrier layer and the Mg-doped p-GaN cap layer. Mg in the Mg-doped p-AlGaN layer in the structure of the magnesium diffusion blocking layer is sufficiently passivated to in the Mg—H bond form, whose bond strength is very large, therefore the activity of Mg can be effectively reduced, thus it is nearly impossible for Mg in the Mg-doped p-AlGaN layer to diffuse downward into the AlGaN barrier layer and the intrinsic u-GaN channel layer. In addition, the doping concentration of Mg in the Mg-doped p-AlGaN layer is greater than the doping concentration of Mg in the Mg-doped p-GaN cap layer, therefore, a specific concentration difference of Mg is formed between them, so that Mg in the Mg-doped p-GaN cap layer can be effectively blocked from diffusing downward, and the diffusion of Mg in the Mg-doped p-GaN cap layer into the AlGaN barrier layer and the intrinsic u-GaN channel layer is also effectively blocked, thus reducing a specific on-resistance of the device, and improving the conducting performance of the device. Therefore, the present invention effectively overcomes various defects in the prior art, and has a high value in industrial use.

The above embodiments only exemplarily illustrate the principles and effects of the present invention, and are not used to limit the present invention. Anyone familiar with the art can modify or change the above embodiments without departing from the spirit and scope of the present invention. Therefore, any equivalent modifications or changes completed by a person of ordinary skill in the art without departing from the spirit and technical concept disclosed in the present invention should still fall within the scope of claims of the present invention.

The invention claimed is:

1. A preparation method for an enhanced GaN-based HEMT device epitaxy, wherein the preparation method comprises:

providing a substrate; and sequentially depositing a C-doped c-GaN high-resistance layer, an intrinsic u-GaN channel layer, an AlGaN barrier layer, a magnesium diffusion blocking layer, and a Mg-doped p-GaN cap layer on the substrate by using a MOCVD process, wherein the magnesium diffusion blocking layer comprises a Mg-doped p-AlGaN layer, Mg in the Mg-doped p-AlGaN layer is sufficiently passivated to in an Mg—H bond form through annealing in a $H_2$ atmosphere, so as to reduce activity of Mg, and a doping concentration of Mg in the Mg-doped p-AlGaN layer is greater than a doping concentration of Mg in the Mg-doped p-GaN cap layer, so as to block Mg in the Mg-doped p-GaN cap layer from diffusing downward;

wherein a method for forming the Mg—H bond in the Mg-doped p-AlGaN layer comprises:

forming an InN layer on the Mg-doped p-AlGaN layer, and then performing the annealing in the $H_2$ atmosphere after the InN layer is formed to make Mg in the Mg-doped p-AlGaN layer sufficiently passivated to form the Mg—H bond form, wherein the InN layer is heated to completely decompose during the $H_2$ annealing process, to ensure that an interface of the Mg-doped p-AlGaN layer is kept from damage caused by the $H_2$ annealing process.

2. The preparation method for the enhanced GaN-based HEMT device epitaxy of claim 1, wherein deposition parameters of the magnesium diffusion blocking layer are as follows:

a growth temperature ranges from 700° C. to 1160° C., and a growth pressure ranges from 20 mbar to 500 mbar.

3. A preparation method for an enhanced GaN-based HEMT device, wherein the preparation method comprises the preparation method for the enhanced GaN-based HEMT device epitaxy of claim 1.

* * * * *